(12) United States Patent
Oh et al.

(10) Patent No.: US 9,871,063 B1
(45) Date of Patent: Jan. 16, 2018

(54) DISPLAY DRIVER SEMICONDUCTOR DEVICE AND MANUFACTURING METHOD THEREOF

(71) Applicant: Magnachip Semiconductor, Ltd., Cheongju-si (KR)

(72) Inventors: Bo Seok Oh, Cheongju-si (KR); Hee Hwan Ji, Daejeon (KR); Jeong Hyeon Park, Daejeon (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/450,083

(22) Filed: Mar. 6, 2017

(30) Foreign Application Priority Data

Jul. 15, 2016 (KR) .................. 10-2016-0090152

(51) Int. Cl.
| | |
|---|---|
| *H01L 29/15* | (2006.01) |
| *H01L 27/12* | (2006.01) |
| *H01L 29/78* | (2006.01) |
| *H01L 21/768* | (2006.01) |
| *G11C 19/00* | (2006.01) |
| *H03K 19/0175* | (2006.01) |

(52) U.S. Cl.
CPC ............ *H01L 27/124* (2013.01); *G11C 19/00* (2013.01); *H01L 21/76897* (2013.01); *H01L 29/7833* (2013.01); *H03K 19/017509* (2013.01)

(58) Field of Classification Search
CPC ............ H01L 27/124; H01L 21/76897; H01L 29/7833; G11C 19/00; H03K 19/017509
USPC ........................................................ 257/72
See application file for complete search history.

(56) References Cited

U.S. PATENT DOCUMENTS

| | | | |
|---|---|---|---|
| 7,329,570 B2 * | 2/2008 | Lee ................. | H01L 21/823814 257/341 |
| 8,269,281 B2 | 9/2012 | Park | |

* cited by examiner

*Primary Examiner* — Tu-Tu Ho
(74) *Attorney, Agent, or Firm* — NSIP Law

(57) ABSTRACT

A display driver semiconductor device includes a high voltage well region being formed on a substrate, a first semiconductor device, a second semiconductor device, and a third semiconductor device. The first semiconductor device is formed on the high voltage well region and includes a first gate insulating layer. The second semiconductor device is formed adjacent to the first semiconductor device and includes a second gate insulating layer. The third semiconductor device is formed adjacent to the second semiconductor device and includes a third gate insulating layer. The first insulating layer may be formed using a chemical vapor deposition (CVD) process and the second insulating layer is formed using a thermal oxide process.

20 Claims, 8 Drawing Sheets

DISPLAY DRIVER SEMICONDUCTOR DEVICE AND MANUFACTURING METHOD THEREOF

CROSS-REFERENCE TO RELATED APPLICATIONS

This application claims the benefit under 35 USC 119(a) of Korean Patent Application No. 10-2016-0090152 filed on Jul. 15, 2016 in the Korean Intellectual Property Office, the entire disclosure of which is incorporated herein by reference for all purposes.

FIELD

The following description relates to a display driver semiconductor device and manufacturing method thereof. The following description also relates to a display driver semiconductor device and manufacturing method thereof that improves the electrical characteristics of the display driver semiconductor device through the composition of a gate oxide layer by combining thermal oxide and chemical vapor deposition (CVD) thermal oxide.

DESCRIPTION OF RELATED ART

In Thin-Layer Transistor Liquid-Crystal Display (TFT-LCD) technology, a column driver is also called a source driver in the sense that it runs a source electrode of TFTs used in the display. For example, when a gate driver enters into an on-status by applying a pulse onto a TFT, the source driver assumes the role of applying a signal voltage onto a pixel through a signal line. Conventionally, an analog driver that directly applies the signal voltage of the analog video onto a display was generally used. However, more recently, a digital driver is often used to apply the signal voltage. Therefore, a source driver IC receives an image data signal and a control signal digitally through an intra-panel interface from a timing controller, generates suitable analog signals, and allows a user to watch generated images on the TFT LCD panel. As the panel requires high definition, slim profile, and reduced power usage, a corresponding driver IC requires a slim form factor while also having more channels and a fast transmission rate.

A digital source driver stores digital signals input from a memory IC in a latch in sequential order, transforms them into analog voltage in DAC, and forwards them to each data line. The digital source driver is composed of a high speed shift register, a latch, a DAC, and a buffer Amplifier.

A conventional Liquid Crystal Display (LCD) source driver IC implements a chip by producing a transistor with two kinds of voltages. The conventional LCD source driver IC uses the method of dual-gate oxidation for implementation. Dual-gate oxidation is used for the purpose of implementing a transistor with two kinds of voltages, specifically, high voltage and low voltage.

Herein, hundreds to thousands of channels are formed for the purpose of driving TV LCD display, and about 70% of the unit channel is composed of high voltage transistor. So the size of the unit high voltage transistor is crucial. In a high voltage transistor when compared to a low voltage transistor, as the thickness of a gate insulation layer (Thick Cox) increases for the high voltage transistor, the size of transistor increases in order to satisfy the breakdown voltage of device. Further, in case of a high voltage transistor, the low-concentration drift region to endure high voltage needs to be increased. Accordingly, as the size of a high voltage transistor increases, the chip size increases proportionally.

Therefore, due to the size of a high voltage transistor being larger than the size of a low voltage transistor, and the need for a high voltage transistor during manufacturing of an LCD source driver IC, there is a need to reduce the overall size of chip.

Particularly, in a conventional LCD driver IC, the circuit mainly composed of high voltage transistors except for the logic voltage. This caused an increase in the overall chip size as the size of the high voltage transistor was relatively big due in-part to the thickness of the gate oxide layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a display driver semiconductor device, includes forming a plurality of trench isolating regions on a substrate defining a first region, a second region, and a third region; forming a high voltage well region on the substrate; forming a pair of low-concentration drift regions inside the high voltage well region on the second and third regions, respectively; forming a low voltage well region inside the high voltage well region on the first region; depositing a chemical vapor deposition (CVD) insulating layer through the first, second, and third regions of the substrate; patterning the CVD insulating layer to remove the CVD insulating layer on the first region and the second region; forming a first thermal oxide layer, a second thermal oxide layer, and a third thermal oxide layer on the first, second, and the third regions, respectively; removing the first thermal oxide layer by patterning and respectively forming a second gate insulating layer and a third gate insulating layer on the second and the third regions; forming a first gate insulating layer on the first region by forming the second thermal oxide layer on the first region; and forming a first gate electrode, a second gate electrode, and a third gate electrode on the first, second, and the third regions, respectively, by depositing and patterning a conductive material on the substrate.

The method may further include forming a Lightly Doped Drain (LDD) region on the first region after forming the first gate electrode, the second gate electrode, and the third gate electrode; forming a first spacer, a second spacer, and a third spacer on side walls of the first, second, and third gate electrodes, respectively; forming a first source and drain regions, a second source and drain regions, and a third source and drain regions on the first, second, and third regions, respectively; forming and patterning a silicide blocking insulating layer on the first region, the second region, and the third region; forming a silicide layer on the first source and drain regions, the second source and drain regions, the third source and drain regions, the first gate electrode, the second gate electrode, and third gate electrode; forming a Borderless contact (BLC) insulating layer on the substrate; forming an interlayer insulating layer on the BLC insulating layer; forming a first source and drain contact plugs, a second source and drain contact plugs, and a third source and drain contact plugs connected to the first source and drain regions, the second source and drain regions, and the third source and drain regions, respectively.

The third gate insulating layer may include a first insulating layer and a second insulating layer.

The first insulating layer may be a CVD insulating layer and the second insulating layer is a thermal oxide layer.

The low voltage well region may have a deeper depth than the low-concentration drift region.

The source and drain regions of the third region may be formed at a predetermined distance from the third spacer.

The silicide blocking insulating layer may be formed extended to the spacer and to the edge of the gate electrode.

The first gate insulating layer may have a thickness smaller than that of the second gate insulating layer.

The first, the second, and the third gate electrodes may be identical to each other in thickness, and lengths of the first and the second gate electrode may be shorter than a length of the third gate electrode.

A dummy gate electrode may be formed on the isolation region.

In another general aspect, a display driver semiconductor device includes a low voltage semiconductor device, a half voltage semiconductor device, and a high voltage semiconductor device. The low voltage semiconductor device includes a first gate insulating layer having a first thickness; a high-concentration first source region and a high-concentration first drain region; a pair of LDD regions having a shallower depth than depths of a first source doping region and a first drain doping region; and a first gate electrode; The half voltage semiconductor device includes a second gate insulating layer having a second thickness; a high-concentration second source and a high-concentration second drain region; a pair of drift regions covering the high-concentration first source region and the high-concentration drain region, respectively; and a second gate electrode. The high voltage semiconductor device is formed on a semiconductor substrate and includes a third gate insulating layer having a third thickness. The third gate insulating layer includes a first insulating layer and a second insulating layer. The first insulating layer is a chemical vapor deposition (CVD) insulating layer and the second insulating layer is a thermal oxide layer. The high voltage semiconductor device further includes a high-concentration third source region and a high-concentration third drain region; a pair of drift regions covering the high-concentration third source region and the high-concentration third drain region, respectively; and a third gate electrode.

A thickness of the second insulating layer may be identical to the second thickness of the second gate insulating layer.

The display driver semiconductor device may further include a first, second, and third spacers formed on the side walls of the first, second, third gate electrodes, respectively; a first silicide layer formed on the third source region and the third drain region; a second silicide layer formed on the third gate electrode; a silicide blocking insulating layer formed between the first silicide layer and the second silicide layer; a BLC insulating layer formed on the first silicide layer, the second silicide layer and the silicide blocking insulating layer; an interlayer insulating layer formed on the BLC insulating layer; and a first, second, and third source and drain contact plugs connected with the first, second, and third source and drain regions, respectively.

The silicide blocking insulating layer may be formed extended to the third spacer and the edge of the third gate electrode.

The first thickness of the first gate insulating layer may be shallower than the second thickness of the second gate insulating layer.

The first thickness, the second thickness and the third thickness may be identical to each other, and lengths of the first and the second gate electrodes may be shorter than a length of the third gate electrode.

The third source and drain region may be formed at a predetermined distance from the third spacer.

In another general aspect, a display driver semiconductor device includes a high voltage well region being formed on a substrate, a first semiconductor device, a second semiconductor device, and a third semiconductor device. The first semiconductor device is formed on the high voltage well region. The first semiconductor device includes a first gate insulating layer having a first thickness; a first source region and a first drain region disposed on opposite sides below the first gate insulating layer; a pair of LDD regions, each LLD region being respectively partially disposed between the first source region and the first drain region; and a first gate electrode disposed above the first gate insulating layer. The second semiconductor device is formed adjacent to the first semiconductor device. The second semiconductor device includes a second gate insulating layer having a second thickness; a high-concentration second source and a high-concentration second drain region disposed on opposite sides below the second gate insulating layer; a pair of drift regions disposed on opposite sides to cover the high-concentration second source region and the high-concentration second drain region, respectively; and a second gate electrode disposed above the second gate insulating layer. The third semiconductor device is formed adjacent to the second semiconductor device. The third semiconductor device includes a third gate insulating layer having a third thickness; a high-concentration third source region and a high-concentration third drain region disposed on opposite sides below the third gate insulating layer; a pair of drift regions disposed on opposite sides to cover the high-concentration third source region and the high-concentration third drain region, respectively; and a third gate electrode disposed above the third gate insulating layer.

The first thickness, the second thickness, and the third thickness have different sizes.

The first insulating layer may be formed using a chemical vapor deposition (CVD) process and the second insulating layer is formed using a thermal oxide process.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
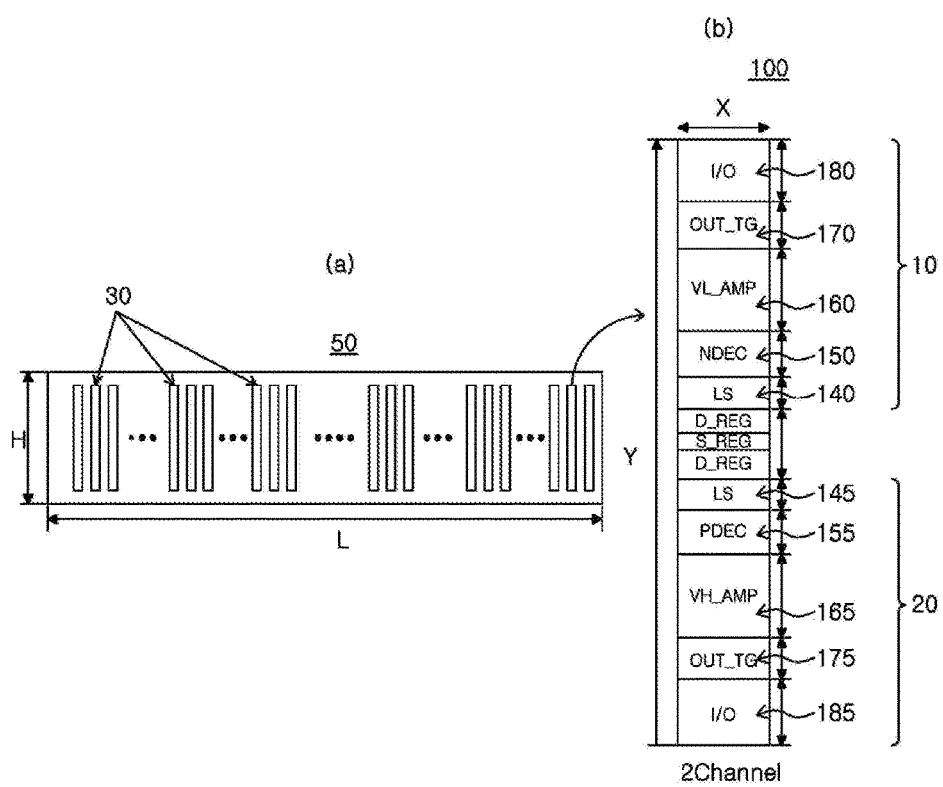
FIG. 1 is a diagram illustrating an example of a semiconductor device for LCD source driver.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

FIG. 1 is a diagram illustrating an example of a semiconductor device for a display driver IC. As illustrated in the example of FIG. 1A, a display driver IC 50 has an L*H size, where L is length and H is height. For the purpose of driving a TV LCD display, hundreds or thousands of output channels 30, which are horizontally arranged in a row, are formed. The greater the number of output channels 30 there are, the higher the degree of definition the display has, because the resolution increases. However, power consumption also increases proportionately. For example, L is determined depending on the number of output channels 30. Thus, choosing an appropriate size of a unit output channel is highly relevant to the proper operation of the display driver IC 50.

As illustrated in the example of FIG. 1B, each output channel 30 forms a channel configuration unit 100 made up of two channels 10 and 20. In the channel configuration unit 100, the width length, which is the Pitch or X value of each channel configuration unit 100 determines the length of the entire chip L by summing together. Because the channel configuration unit 100 is formed hundreds or thousands of times, the smaller the size of the channel configuration unit 100 in the X direction, is the greater the likelihood in achieving a greater net die. Accordingly, the width of unit channel is desired to be small to in order to secure a high net die. The described examples provide a way to reduce the length of pitch X of the channel configuration unit 100. Also, the length of the Y axis of the channel becomes the height H of the driver IC.

When magnified, the block diagram of the channel configuration unit 100 includes two channel blocks 10, 20 that are arranged next to each other. Each semiconductor device is arranged symmetrically around the center. A first channel block 10 includes a level shifter (LS) 140, NDEC 150, VL_AMP 160, OUT_TG 170, and I/O 180.

A second channel block 20 includes a level shifter (LS) 145, PDEC 155, VL_AMP 165, OUT_TG 175, and output pad (I/O) 185.

Figure 2:
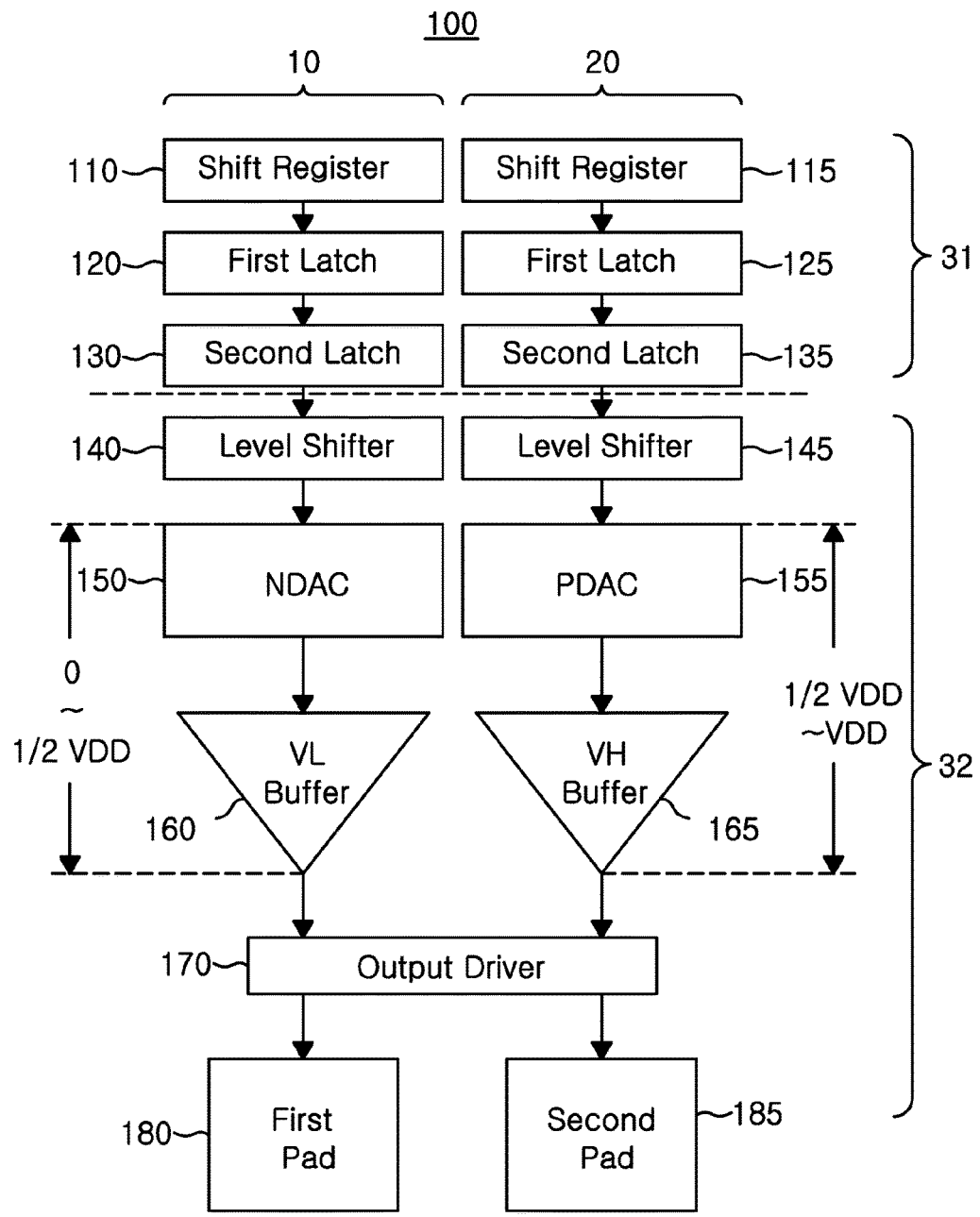
FIG. 2 is a diagram illustrating an example of a channel configuration unit.

With respect to the first channel block 10 and the second channel block 20, TG means a transmission gate. NDEC and PDEC mean a negative decoder and a positive decoder respectively. It is to be noted that the NDEC and PDEC are matched to the NDAC and PDAC, as illustrated in FIG. 2. Furthermore, VL_AMP 165 is also to be matched to a VL buffer or a VH buffer, as illustrated in FIG. 2. An OUT_TG 175 is matched to an output driver, as illustrated in FIG. 2.

FIG. 2 is a diagram illustrating an example of a channel configuration unit 100 made up of two channels of display driver IC 50.

The channel configuration unit 100 of a display driver IC 50 includes a first channel unit 10 and a second channel unit 20. In this example, even though only two channels are shown for the display driver IC 50, the display driver IC 50 is typically formed by thousands of repeated channels. For example, the first channel unit 10 includes a shift resistor 110, a first latch 120, a second latch 130, a level shifter 140, a first digital analog converter (NDAC) 150, a buffer 160, an output driver 170, and a first pad 180. The second channel unit 20 includes a shift resistor 115, a first latch 125, a second latch 135, a level shifter 145, a second digital analog converter (PDAC) 155, a buffer 160, an output driver 170, and a second pad 185.

In the example of FIG. 2, the shift registers 110, 115 function to manage shifting digital data synchronized with a clock signal. Accordingly, a shift register takes the role of generating pulse signals in a sequential order using the clock signal. The first latch to the fourth latch 120, 125, 130, 135 assume the role of storing digital data. The level shifters 140, 145 each convert a low voltage input signal into a high voltage input signal.

The first Digital-to-Analog Converter (DAC) and the second DAC 150, 155 convert digital input signals to analog signals. Furthermore, the digital analog converters 150, 155 is an NMOS digital analog converter (NDAC) 150 and a PMOS digital analog converter (PDAC) 155. The first channel has a value of 0 or ½ VDD and the second channel has a value of ½ VDD or VDD.

The VL and VH buffers 160, 165 are formed by connecting several inverters in series. The buffers increase charging speed by reducing the output resistance of a signal and increasing the driving current. Accordingly, the buffers reduce signal delay. The VL and VH buffers 160, 165 consist of a Voltage Low (VL) buffer 160 and a Voltage High (VH) buffer 165 corresponding to channels 10, 20.

Although only two random channels are shown herein, the channels are repetitively forms hundreds to thousands of times in an LCD driver device.

Accordingly, the channel configuration unit 100 is divided into two blocks 31, 32 according to voltage applied to gate or drain electrodes in the blocks 31, 32.

The first block is a low voltage block 31 and may be manufactured using a low voltage transistor. Therefore, a shift register 110, the first latches 120, 125, and the second latches 130, 135 all consist of low voltage transistors.

The second block is a high voltage block 32 and may be manufactured using a high voltage transistor. A high voltage ranging from 8V to 30V may be applied to more than one terminal of the gate electrode or the drain electrode. Medium voltages or high voltages having values higher than the low voltage values are all considered to be high voltages. This approach is used because a driving voltage with a high voltage is required for large size screen output such as LCD, LED, UHD, AMOLED TVs, due to the power requirements of such screens. For instance, as 70% of a display driver IC 50, in an example, is made up of high voltage transistors, a high voltage transistor is an important part for determining the overall chip size.

The high voltage block 32 includes level shifters 140, 145, digital analog converters 150, 155, a VL and a VH amplifier 160, 165, and an output driver 170 and output pads 180, 185. Herein, the pads 180, 185 can be composed of a first pad or Odd Pad 180 and a second pad or Even Pad 185. The level shifters 140, 145, the digital analog converters 150, 155, the VL and VH buffer 160, 165, and the output drivers 170, 175 are manufactured by using high voltage transistors.

The composition of the semiconductor device used for a high voltage block 32 is as follows: the level shifters 140, 145 are composed of an EDMOS (extended drain metal oxide semiconductor) semiconductor device (not illustrated). The digital analog converters 150, 155 are composed of logic half voltage (Logic MV, LMV) semiconductor device (not illustrated).

Figure 4:
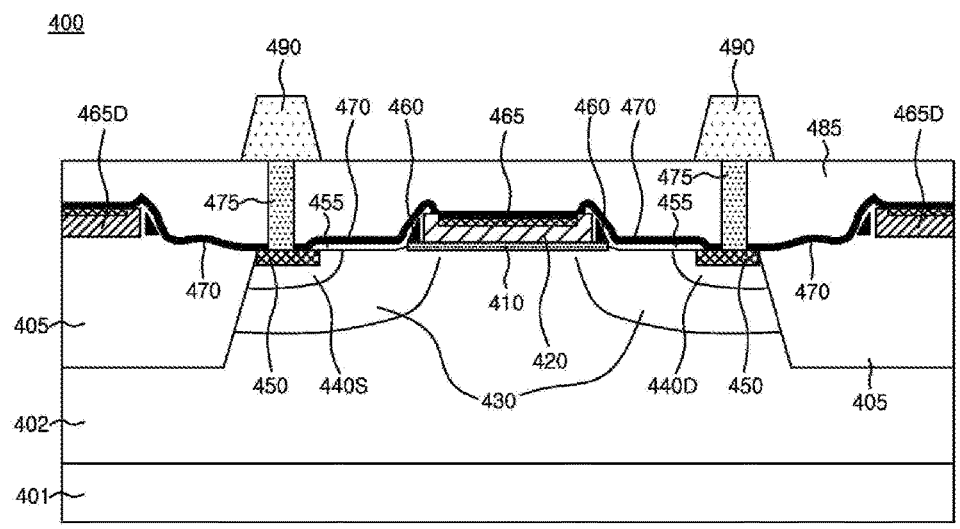
FIG. 4 is a cross-sectional view illustrating an example of a structure of a half voltage semiconductor device.

The single gain amplifiers 160, 165 can consist of a half voltage transistor shown in FIG. 4, 400. A high voltage single gain amplifier 160 can consist of a half voltage, FIG. 4, 400. The high voltage single gain amplifier 160 consist of the semiconductor device in which ½ high voltage, namely, half voltage is applied to the gate electrode, FIG. 4, 420 and the drain contact plug, FIG. 4, 475. Therefore, the high voltage single gain amplifier consists of a half voltage semiconductor device, FIG. 4, 400, wherein half voltage is applied to a drain contact plug, FIG. 4, 475, and the thickness of the half voltage gate insulator, FIG. 4, 410 is reduced according to the predetermined ratio (for instance, ½) compared to the thickness of high voltage. As a ½ high voltage, namely, a half voltage (½ HV) is applied to the drain contact plug, FIG. 4, 475, a semiconductor device with small design rule is used. As the drain voltage is half reduced, the gap between the side wall of the gate electrode and the drain contact electrode can be reduced as much. As the entire chip size is reduced when the size of a single device is reduced, the number of net die increases.

Accordingly, the mis-matching characteristic of a semiconductor device can be improved by the reduction of the design rule, the current increase, and the reduction of the thickness of the half voltage gate insulator 410. Further, the offset characteristic of the high voltage single gain amplifier 160 can be improved. Accordingly, a high voltage single gain amplifier 160 according to an example manufactures a circuit with a reduced size by using a half voltage semiconductor device 400 wherein the mis-matching characteristic is improved.

Figure 5:
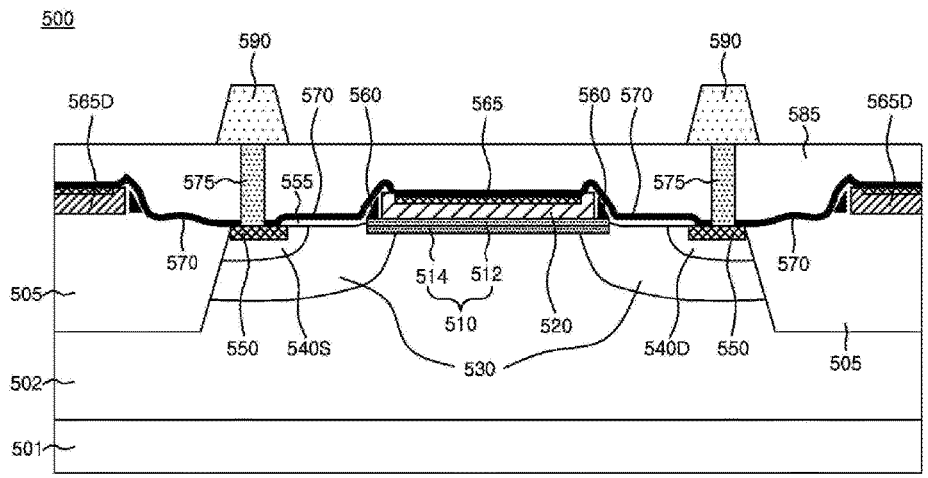
FIG. 5 is a cross-sectional view of a low Ron high voltage semiconductor device.

The output driver 170 consists of low Ron high voltage semiconductor device, FIG. 5, 500, according to an example. The output driver 170 has a fast slew rate. The output driver 170 consists of a gate electrode, FIG. 5, 520, and a semiconductor device wherein high voltage is applied to a drain contact plug, FIG. 5, 575.

Like this, a high voltage block 32 consists of at least one of the semiconductor devices among an EDMOS semiconductor device (not illustrated), a logic half voltage semiconductor device (not illustrated), a half voltage semiconductor device 400 and a low Ron high voltage semiconductor device 500. Accordingly, a display driver semiconductor device 50 according to an example can guarantee optimal performance by using a circuit composed of a semiconductor device suitable for voltage (for instance, high voltage or half voltage) used for each circuit. Further, more chip or die can be obtained by reducing the chip size.

[TABLE 1] is a table comparing a low voltage semiconductor device, a half voltage semiconductor device, and a high voltage semiconductor device of a display driver semiconductor device 50 according to an example.

TABLE 1

| Semiconductor Device | Semiconductor Device Structure | Gate(G) and Drain(D) Applied Voltage | Gate insulating layer Thickness (Gox) | Gate Length (Lg) |
|---|---|---|---|---|
| Low Voltage | LV MOS | All LV | Gox < 5 nm | |
| Half Voltage | Half Voltage MOS | All ½ High Voltage | Gox: 10-30 nm | Lg (Half Voltage) < Lg (High Voltage) |
| High Voltage | High Voltage MOS | All High Voltage | Gox: 30-70 nm | Lg(High Voltage) > Lg(Low Voltage, Half Voltage) |

Figure 3:
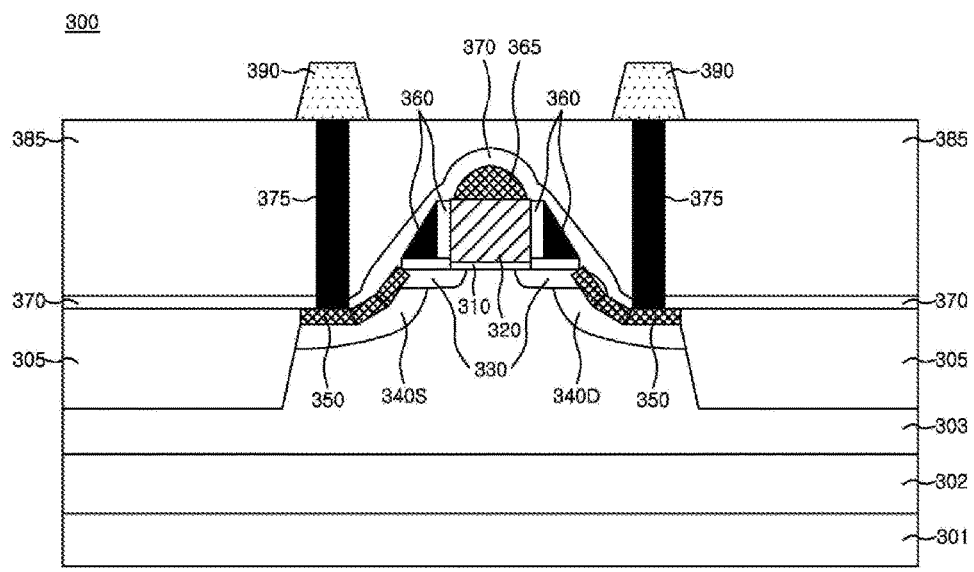
FIG. 3 is a cross-sectional view of a low voltage semiconductor device used for a shift register, a first latch, and a second latch in the present disclosure.

FIG. 3 is a cross-sectional view of a low voltage semiconductor device 300 used for the shift register 110, the first latches 120 and the second latches 130 of the present disclosure.

As illustrated in FIG. 3, a low voltage semiconductor device (LV device, 300) is an N-channel semiconductor device having a high voltage P-type well region (HPW) 302 formed on a P-type substrate 301. The low voltage semiconductor device (300) is called a LV device, a first semiconductor device, or a LV region. A low voltage P-type well region (PW) 303 is formed inside a high voltage P-type well region 302. Further, for the separation between devices, plurality of isolating regions 305 are formed. The PW 303 is formed deeper than the depth of the isolation region 305. Shallow trench isolation (STI) or Middle trench isolation (MTI) may be used depending on needs for the structure of the isolation region. The depth of the STI structure is between 0.3 um to 0.5 um. The depth of the MTI structure is between 0.5 um to 2 um.

The depth of MTI is between 300-1000 nm according to the voltage applied to the drain contact plug 375. When the drain applied voltage is around 18V, the depth is around 600-1000 nm and when the drain applied voltage is around 13.5V, the depth is around 500-800 nm. When the drain applied voltage is around 9V, the depth is around 400-700 nm. When both STI/MTI are applied, it is called a dual trench and such process may be about one or two. Most of the Large Display Driver IC (LDDI) technology use an MTI structure, and most of Mobile Display Driver IC (MDDI) technology used in home appliances use an STI structure, the depth of which is between 300 to 400 nm. This is because an STI structure is not really necessary due to the difficulty in manufacturing the dual trench process and the high voltage (HV) device taking up about 80 to 90% of the area in an LDDI. On the contrary, MTI is not necessary to be formed in cases where MDDI technology used in Low Voltage (LV) devices, such as SRAM, take up more than 90%. Therefore, in cases where LDDI technology is used in a number of SRAM structures, dual trench structure (STI, MTI) may be used.

An N-type LDD (Lightly Doped Drain) region 330, an N-type source region 340S and a drain region 340D are formed inside a P-type well region (PW). The LDD region 330 takes the role of relieving the electric filed of the high-concentration drain region 340D. It also functions as reducing hot carrier injection (HCI). Therefore, as illustrated in FIG. 3, the LDD region is formed close to the high-concentration doping source/drain regions (340S/340D) without encompassing the high-concentration doping region. Accordingly, the depth of the LDD region 330 is far shallower than the depth of the drift region.

A gate insulating layer 301 and a silicide layer 350 are formed on the surface of a P-type substrate 301. The gate insulating layer 310 is called a low-concentration gate insulating layer, a first gate insulating layer or LV gate insulating layer. An N-channel or P-channel low-concentration semiconductor device 300 signifies that low voltage below 5V is applied to a gate and drain terminal. The thickness of the gate insulating layer 310 is very shallow, below 5 nm. An N-type gate electrode 320 and a silicide layer 365 are formed on the gate insulating layer 310, and a spacer 360 is formed on the side of the gate.

A Borderless contact (BLC) insulating layer 370 is formed to form a BLC of a source/drain contact plug 375. The BLC insulating layer 370 is also formed on the gate electrode 320, source/drain doping regions 340S, 340D, and the isolation region 305. The BLC insulating layer 370 is formed using a silicon nitride (SiN) or a silicon oxynitride (SiON) and it contains the source/drain contact plug 375 connected to the source/drain regions 340S, 340D. A thick interlayer insulating layer 385 is formed on the BLC insulating layer 370. And a metal wiring layer 390 connected with the source/drain contact plug 375 is formed.

The low voltage semiconductor device 300 also contains a P-channel semiconductor device (not illustrated). A P-channel of an opposite channel forms conductivity in a way contrary to the N-channel semiconductor device which is explained above.

FIG. 4 is a cross-sectional view illustrating a structure of a half voltage semiconductor device according to an example.

As illustrated in FIG. 4, a half voltage semiconductor device 400 forms a high voltage P-type well region (HPW) 402 on a P-type substrate 401. The half voltage semiconductor device 400 is called a FV device, a second semiconductor device, or a FV region. A plurality of isolating regions 405 are formed on the HPW 402 and a pair of low concentration N-type drift regions 430 are formed inside HPW 402. Herein, the drift region 430 has a low doping concentration to relieve the electric field of the high-concentration doping region. When the electric field is relieved, the breakdown voltage increases. A high voltage semiconductor device mostly configured to use a drift region that enfolds the high-concentration doping source/drain region. This is to guarantee a high breakdown voltage. It is hard to secure a high breakdown voltage with LDD regions.

A half voltage gate insulating layer 410, a spacer 460, a gate electrode 420, and a silicide layer 465 are formed on a P-type substrate 401. The gate insulating layer 410 is called a half voltage gate insulating layer, a second gate insulating layer or a FV gate insulating layer. In a half voltage semiconductor device 400, a half voltage of the high voltage semiconductor device 500 (½ high voltage) is applied to the gate electrode 420. For instance, when 20V is applied to the gate electrode 520 of the high voltage semiconductor device 500, 10V (=20V/2) is applied to the gate electrode 420 of the half voltage semiconductor device 400. Therefore, the thickness of the half voltage gate insulating layer 410 of the half voltage semiconductor device 400 may be 15-35 nm instead of 30-70 nm.

An N-type high-concentration doping source region 440S and a drain region 440D are respectively formed inside one pair of drift regions 430. And a silicide layer 450 is formed on the high-concentration doping regions 440S, 440D. Further, a source/drain contact plug 475 connected with the source/drain regions 440S, 440D is formed. When the source region 440S and the drain region 440D are formed, they are aligned in the spacer 460 and are formed by ion injection. However, according to the example illustrated in FIG. 4, the source region 440S and the drain region 440D are formed at a predetermined distance by ion injection without being aligned in the spacer 460. The breakdown voltage may increase more by the method.

Further, as illustrated in FIG. 4, a silicide blocking insulating layer 455 is formed between a silicide layer 450 formed on a surface of the substrate and the spacer 460. The silicide blocking insulating layer 355 takes the role of preventing the formation of silicide. SiO2, SiN, SiON, TEOS, HLD, HTO, and the like may be used for the silicide blocking insulating layer 455. The silicide blocking insulating layer 455 is formed extended to the spacer 460 and the gate electrode 420. Therefore, the silicide layer 465 formed on the gate electrode 420 is only formed on a partial region of the surface of the gate electrode 420. It is not formed extended to the side wall of the gate electrode 420. The height of the two edges of the gate electrode 420 is formed higher than the center of the gate electrode 420. This is because the silicide blocking insulating layer 455 is extended to the two edges of the gate electrode 420.

The silicide layer 465 such as a cobalt silicide (CoSi2) or a nickel silicide (NiSi) formed on the gate electrode 420 is formed in conjunction with a silicone on a substrate or poly-Si. Therefore, a substrate or polysilicon layer covered by a silicide blocking insulating layer 455 cannot participate in reaction. On the contrary, an exposed polysilicon or substrate, which is not covered by a blocking insulating layer, participates in reaction and forms a silicide layer. Therefore, when a surface of a polysilicon is changed to a silicide layer, the thickness is reduced compared to the previously deposited thickness of the polysilicon. Further, a part of the poly-Si which is not covered by the silicide blocking insulating layer 455 may be lost by dry etching process. Therefore, although the thickness of the polysilicon below the silicide blocking insulating layer 455 is maintained, the thickness of polysilicon in the rest region may be reduced.

A BLC insulating layer 470 is formed to form a borderless contact. The BLC insulating layer 470 is also formed on a gate electrode 420, source/drain doping regions 440S, 440D, an isolation region 405, and a silicide blocking insulating layer 455. The BLC insulating layer 470 may be composed of a silicon nitride (SiN) or a silicon oxynitride (SiON). A thick interlayer insulating layer 485 is deposited on the BLC insulating layer 470 and a metal wiring layer 490 connected with the source/drain contact plug 475 is formed on the interlayer insulating layer 485.

A plurality of dummy gate electrodes 465D are formed on the isolation region 405. A plurality of dummy gate electrodes 465D are formed at the same time alongside with the gate electrode 420 formed on the drift region 430. This is to maintain a pattern density in the gate dry etching process. Due to this, the gate electrode etching speed can be maintained at a predetermined speed. And a BLC insulating layer 470 is formed on the plurality of dummy gate electrodes 465D.

FIG. 5 is a cross-sectional view of a low Ron high voltage semiconductor device according to an example. It is almost similar to the cross-sectional view of the half voltage semiconductor device 400 but the thickness of the gate insulating layer and the length (Lg) of gate electrode are different.

As illustrated in FIG. 5, the high voltage semiconductor device 500 comprises a well region for high voltage (HPW) 502, formed on a P-type substrate 501, and first and second isolating regions 505. The high voltage semiconductor device 500 is called a HV device, a third semiconductor device, or a HV region. A pair of N-type low-concentration drift region 530 is formed inside HPW 502. The high voltage semiconductor device 500 comprises N-type high-concentration doping source region 540S and a drain region 540D, which are respectively formed in low-concentration drift region 530. The high voltage semiconductor device 500 comprises a silicide layer 550 formed on the source region 540S and drain region 540D, a source contact plug 575, and a drain contact plug 575.

The high voltage semiconductor device 500 comprises a high voltage gate insulating layer 510 formed between the source region 540S and the drain region 540D, a spacer 560, a gate electrode 520 and a silicide layer 565 formed on a gate electrode 520. The gate insulating layer 510 is called a high voltage gate insulating layer, a third gate insulating layer, or a HV gate insulating layer. The silicide layer 550 and the silicide layer 565 are respectively called a first silicide layer and a second silicide layer. In the high voltage semiconductor device 500, the source/drain regions 540S, 540D are not aligned in the spacer 560 of the gate electrode 520 but are formed at a predetermined distance. It is similar to the structure of FIG. 4. However, the thickness of the gate insulating layer 510 is between 30-70 nm. This is because a voltage of 10-30 V is applied to the gate electrode 520. Compared to the above half voltage semiconductor device 400, twice as much voltage is applied to the gate electrode 520 of the high voltage semiconductor device 500. Therefore, it is 1.5 to 3 times thicker than the thickness of the gate insulating layer 410 of the half voltage semiconductor device 400. The gate insulating layer 510 of the high voltage semiconductor device 500 comprises a first insulating layer 510 and a second insulating layer 514, and it is composed of at least two layers. The first insulating layer 512 is a CVD-type oxide layer manufactured by Chemical Vapor Deposition (CVD) method such as a Low-Pressure Chemical Vapor Deposition (LPCVD). An oxide layer using Tetraethyl orthosilicate (TEOS) material is one of the representative CVD-type oxide layers. The second insulating layer 514 is a thermal oxide layer manufactured by thermal oxidation method. The first insulating layer 512 is first formed by the CVD method, and the second insulating layer 514 is formed later. The second insulating layer 514 is formed on the surface of the substrate below the first insulating layer as the second insulating layer 514 is formed by a direct reaction between oxygen gas and the semiconductor substrate 501.

Further, as illustrated in FIG. 5, a silicide blocking insulating layer 555 is formed between the silicide layer 550 formed on the surface of the substrate and the spacer 560. The silicide blocking insulating layer 555 is formed extended to the spacer 560 and to the gate electrode 520. Therefore, the silicide layer 565 formed on the gate electrode 520 is formed on a partial region of the surface of the gate electrode 520 and is not formed extended to the side wall of the gate electrode 520. The height of the two edges of the gate electrode 520 is formed higher than the center of the gate electrode 520. This is because the silicide blocking insulating layer 555 is extended to the two edges of the gate electrode 520.

As shown in FIG. 4, a silicide layer 565 such as a cobalt silicide (CoSi2) or a nickel silicide (NiSi) formed on the gate electrode 520 is formed conjoined with a substrate or a silicone of polysilicon. Therefore, a substrate or polysilicon layer covered by a silicide blocking insulating layer 555 cannot participate in reaction. On the contrary, an exposed polysilicon or substrate, which is not covered by a blocking insulating layer, participates in reaction and form a silicide layer. Therefore, when a surface of a polysilicon is changed to a silicide layer, the thickness is reduced compared to the previously deposited thickness of the polysilicon. Further, a part of the poly-Si which is not covered by the silicide blocking insulating layer 555 may be lost by dry etching process. Therefore, although the thickness of the polysilicon below the silicide blocking insulating layer 555 is maintained, the thickness of polysilicon in the rest region may be reduced.

A BLC insulating layer 570 is then formed to form a borderless contact. The BLC insulating layer 570 is also formed on a gate electrode 520, source/drain doping regions 540S, 540D, an isolation region 505, and a silicide blocking insulating layer 555. The BLC insulating layer 470 may be composed of a silicon nitride (SiN) or a silicon oxynitride (SiON). A thick interlayer insulating layer 585 is deposited on the BLC insulating layer 570. A metal wiring layer 590 connected with the source/drain contact plug 575 is formed on the interlayer insulating layer 585.

A plurality of dummy gate electrodes 565D are then formed on the isolation region 505. A plurality of dummy fate electrodes 565D are formed at the same time alongside with the gate electrode 520 formed on the drift region 530. This is to maintain a pattern density in the gate dry etching process. Due to this, the gate electrode etching speed can be maintained at a predetermined speed. A BLC insulating layer 570 is formed on the plurality of dummy gate electrodes 565D.

Figure 6:
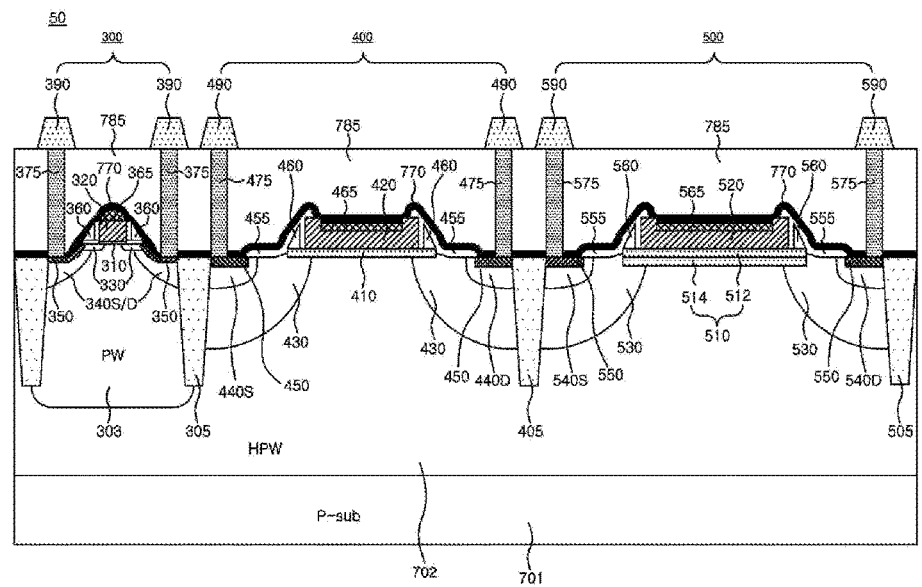
FIG. 6 is a cross-sectional view illustrating an example of a display driver semiconductor device formed on a substrate.

FIG. 6 is a cross-sectional view illustrating an example of a display driver semiconductor device formed on a substrate. The isolating regions 305, 405, 505 with the identical depths are formed, and a LV device 300, a FV device 400, and a HV device 500 are formed between the isolating regions 305, 405, 505.

The display driver semiconductor device 50 is formed by integrating various semiconductor devices on a substrate 701. For instance, a first semiconductor device (LV device), 300, a second semiconductor device (FV device), 400, and a third semiconductor device (HV device), 500, are included. The first semiconductor device 300 comprises a first gate insulating layer 310 with a first thickness, high-concentration first source and drain regions 340S, 340D, a pair of first LDD regions 330 having a shallower depth compared to the first source and drain doping regions 340S, 340D, and a first gate electrode 320.

The second semiconductor device 400 comprises a second gate insulating layer 410, which is a half voltage gate insulating layer having a second thickness, thicker than the first thickness, high-concentration second source and drain regions 440S, 440D, a pair of drift regions covering the second source and drain regions 440S, 440D respectively, and a second gate electrode 420. The second gate insulating layer 410 is a thermal oxide layer manufactured by a thermal method. As a thermal oxide layer has a higher quality than a CVD thin layer, it is often used for a gate insulating layer. Herein, the depth of the drift regions 430, 530 of the second conductivity (N type) is shallower than the depth of the well region 330 of the first conductivity (P type).

The third semiconductor device 500 comprised a third gate insulating layer 510, high-concentration third source and drain regions 540S, 540D, a pair of drift regions 530 covering the third source and drain regions 540S, 540D respectively, and a third gate electrode 520. Herein, the length of the third gate electrode 520 is longer than the lengths of the first and the second gate electrodes 320, 420. The length of the second gate electrode 420 is longer than the length of the first gate electrode 320. The third gate insulating layer 510 is composed of two layers (the first insulating layer 512 and the second insulating layer 514). The first insulating layer 512 is a CVD oxide layer and the second insulating layer 514 is a thermal oxide layer. The thickness of the second insulating layer 514 is identical to the thickness of the second gate insulating layer 410 of the second semiconductor device 400 as they form together. The first insulating layer 512 deposited by CVD method is used for a gate insulating layer as it maintains its thickness at such areas as a trench corner. As the third gate insulating layer 510 is formed as a double layer of a CVD-type thin layer and an insulating layer of a thermal oxide method, the thickness of the entire gate insulating layer is uniform and the quality of the insulating layer is good. When it is only formed by a thermal oxide layer, the thickness of it may be very thin at a trench corner compared to an active region on a substrate. When it is thick between 30-70 nm, the contrast becomes more striking. Therefore, when a gate insulating layer of 30-70 nm thickness is formed, it is formed by an appropriate combination of the two methods.

The second source and drain regions 440S, 440D in the second semiconductor device 400 are formed at a regular distance from the second spacer 460 formed on the side wall of the second gate electrode 420. In the same way, the third source and drain regions 540S, 540D in the third semiconductor device 500 are formed at a regular distance from the third spacer 560 formed on the side wall of the third gate electrode 520. Further, the thicknesses of the first, second, and third gate electrodes 320, 420, 520, are identical to each other, and a plurality of the isolating regions 305, 405, 505, formed between the first, second, and the third semiconductor devices 300, 400, 500, have a trench structure. The depths of the trenches are identical.

The gate voltage and drain voltage applied to the second semiconductor device 400 is ½ of the gate voltage and drain voltage applied to the third semiconductor device 500.

FIGS. 7A to 7F are drawings illustrating an example of a manufacturing method of the structure illustrated in FIG. 6.

Figure 7A:
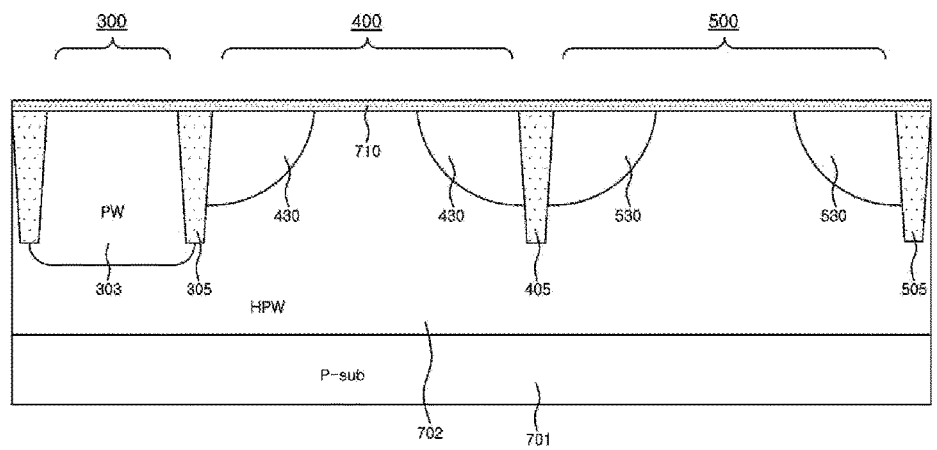
FIGS. 7A to 7F are cross-sectional views illustrating an example of a manufacturing method of the structure illustrated in FIG. 6.

In FIG. 7A, a plurality of trench isolating regions 305, 405, 505, are formed on a P-type substrate 701 to form a LV device, or a LV region 300, a FV device or a FV region 400, a HV device or a HV region 500. As mentioned above, the depth of the trench is 0.5-2 um. A high voltage well region (HPW), 702, is formed. The high voltage well region 702 is also used as a channel region for a HV device and a FV device, and to relieve the electric field, a plurality of low-concentration N-drift regions 430, 530, are formed. A P-type well region (PW), 303, is formed to form an N-channel MOSFET of the low voltage semiconductor device 300. When a P-type MOSFET is formed, an N-type well region (NW, not illustrated) may be formed. Forming a drift region, a process of drive-in annealing may be added after an ion injection for dopants diffusion. The PW (303) is composed of a retrograde well, which signifies several times of ion injection by differentiating ion injection energy each time. The depth of the PW (303) is deeper than the depths of the drift regions 430, 530 and the trench isolating regions 305, 405, 505, and shallower than the depth of the high voltage well 702. And a CVD-type thick gate insulating layer 710 is formed, wherein the thickness is 10-50 nm. As the CVD method is used, deposition is all happened on the surface of a substrate.

Figure 7B:
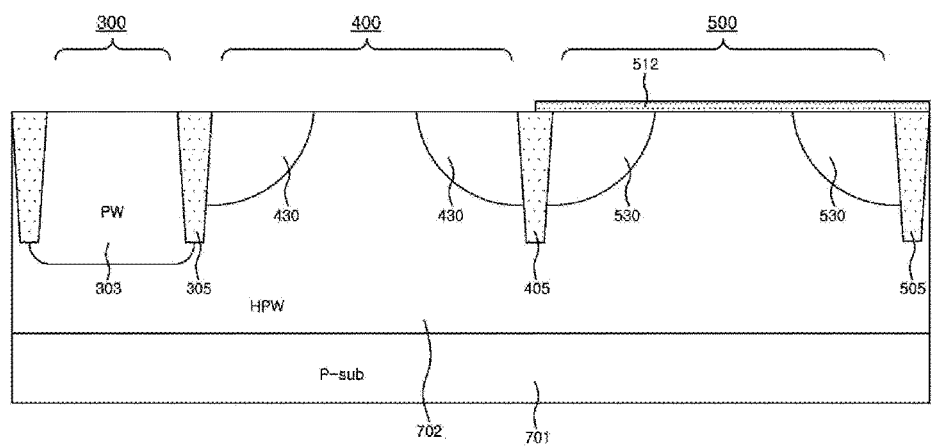

As illustrated in FIG. 7B, the portion of the insulating layer 710 in LV region 300 and in FV region 400 is eliminated by patterning process but a first insulating layer 512 used in the HV device 500 remains.

Figure 7C:
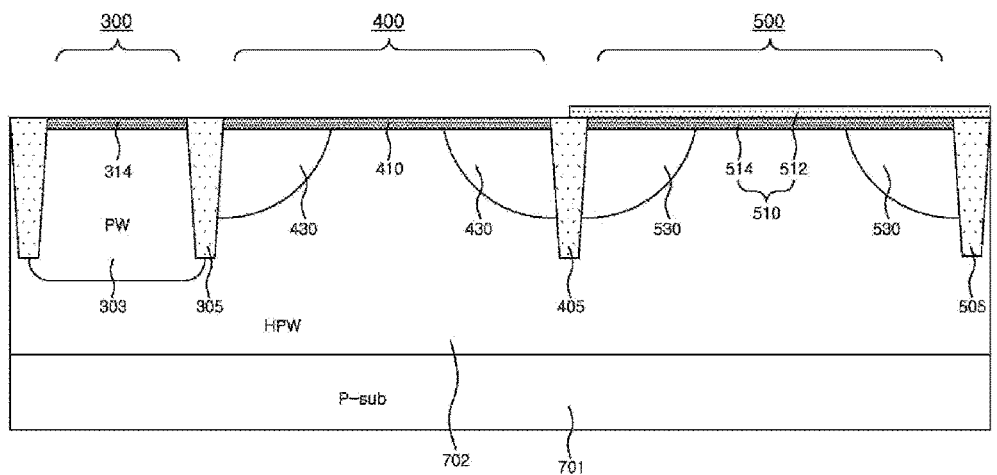

As illustrated in FIG. 7C, a second gate insulating layer 410 is formed by thermal oxidation. The gate insulating layers 314, 410, 514 are formed on the LV region 300, FV region 400, HV region 500, respectively with identical thickness. Herein, the thickness of the gate insulating layers, 314, 410 and 514 is between 10 to 50 nm. In the process of forming gate insulating layers 314, 410 and 514, as the oxygen gas directly reacts with the substrate, the gate insulating layers, 314, 410 and 514 are respectively formed on the region where the substrate is exposed. The insulating layer 314 formed on the LV region 300 by patterning is eliminated (not illustrated). As a result, a FV gate insulating layer 410 is formed on the FV region 400 and a HV gate insulating layer 510 is formed on the HV region 500.

The HV gate insulating layer 510 is composed of two layers of the first insulating layer 512 and the second insulating layer 514. The second insulating layer 514 is formed at the same time when the second gate insulating layer 412 of the FV region 400 is formed. The second insulating layer 514 is formed by thermal oxidation. Oxygen gas passes through the first insulating layer 512 and reacts with a substrate below the first insulating layer 512. Although the second insulating layer 514 is formed later, the positions of the first and the second insulating layers, 512 and 514 are changed by thermal oxidation. If the second insulating layer 514 is manufactured by CVD method, it is formed on the first insulating layer 512. However, according to an example, it is formed close to the surface of a substrate according to the thermal oxidation method. The second insulating layer 514 has fewer defects than the first insulating layer 512 as it is a kind of a thermal oxide layer. The quality of the second insulating layer 514 is far better than the first insulating layer 512 as the second insulating layer 514 has fewer impurities.

In the FIG. 7D, a gate insulating layer 310 of the LV device 300 is formed by thermal oxidation to have a thickness below 5 nm. Manufactured accordingly, the gate insulating layers, 310, 410, 510, having three different thicknesses are formed on the first substrate 701. The plurality of gate insulating layers 310, 410, 510, comprise a low voltage gate insulating layer 310, a half voltage gate insulating layer 410, and a high voltage gate insulating layer 510. The thickness of the gate insulating layer increases in sequential order of a low voltage gate insulating layer 310, a half voltage gate insulating layer 410, and a high voltage gate insulating layer 510.

Figure 7D:
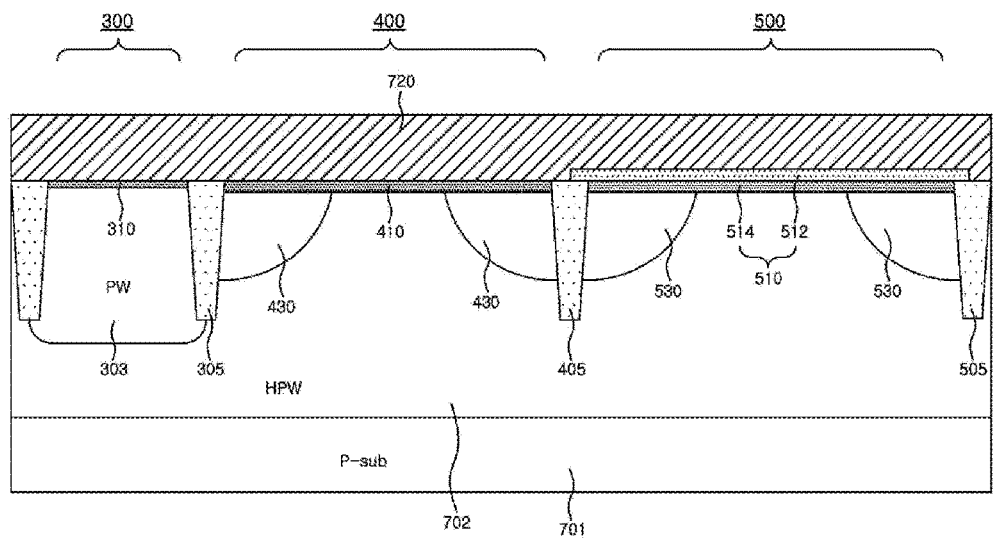

Further, in the FIG. 7D, a conductive material, 720, is deposited to form a gate electrode. Metal or poly-Si materials are deposited by CVD method throughout the entire region.

Figure 7E:
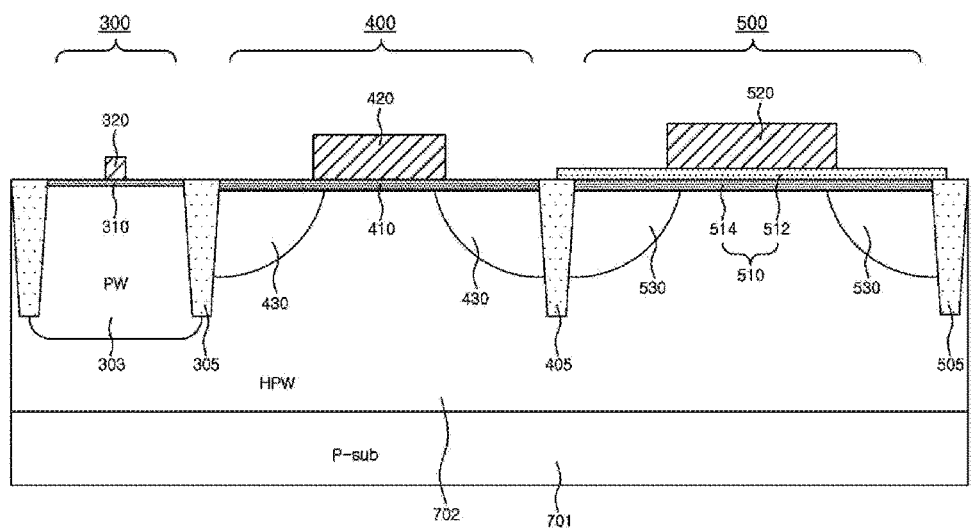
Figure 7F:
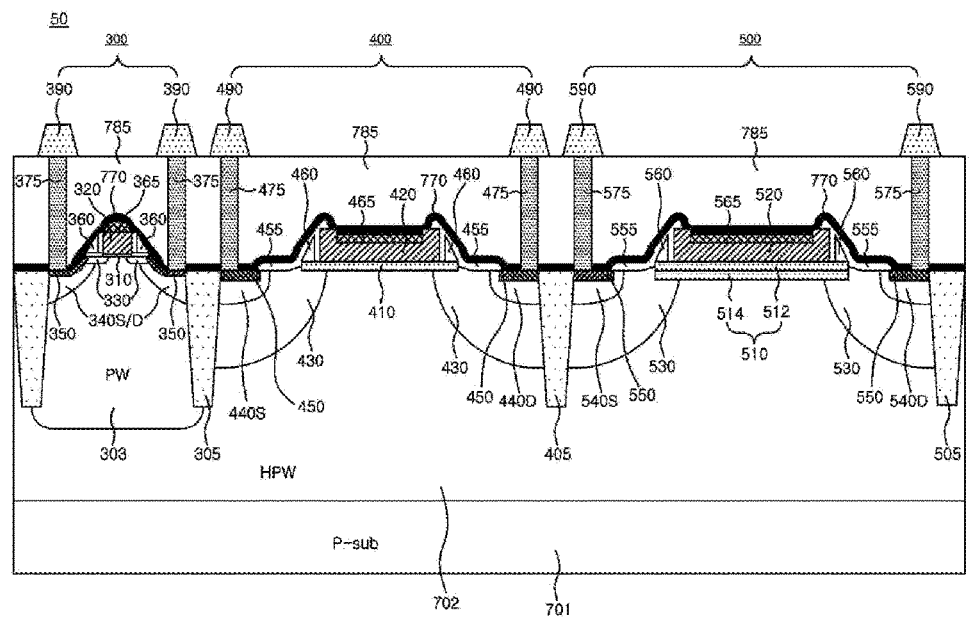

In the FIG. 7E, a low voltage gate electrode 320, a half voltage gate electrode 420, and a high voltage gate electrode 520 are formed by patterning process. Herein, in a FV device 400 and a HV device 500, the gate electrodes 420, 520, and the drift regions 430, 530 are overlapped. The thickness of the low voltage/half voltage/high voltage electrodes 320, 420, 520 are identical. But only the voltages applied to each gate electrodes 320, 420, 520 are different.

A plurality of LDD regions 330 are formed to form a low voltage semiconductor device 300. The LDD region is not formed in the half voltage and high voltage regions. Instead, low-concentration drift regions 430, 530 are already formed. A first, second, and third spacers 360, 460, 560 are formed on the sides of the first, second, and third gate electrodes. A first, second, and third high-concentration doping source/drain regions 340S/D, 440S/D, 540S/D are respectively formed. Herein, in the half voltage semiconductor device 400 and the high voltage semiconductor device 500, the second and third source/drain regions 440S/D, 540S/D are formed at a regular distance from the second and the third spacers 460, 560. And in this way, a gap is made between the second, third source/drain regions 440S/D, 540S/D, and the second, third spacers 460, 560, and the resistance increases. Due to the fact, a high breakdown voltage is secured. However, in the low voltage semiconductor device 300, the first source/drain region 340S/D is formed aligned to the first spacer 360 to increase the drain current. A Short channel is formed.

A silicide blocking insulating layer is deposited to selectively form a silicide layer after the first, second, and third source/drain regions 340S/D, 440S/D, 540S/D are formed. After depositing, patterned blocking layers 455, 555, are formed on the FV, HV regions 400, 500 by patterning. Cobalt, Nickel, or Titanium (Ti) metal is deposited on the substrate and gate electrode to form a silicide. The silicide layers 350, 450, 550, 365, 465, 565 are formed on the substrate and gate electrode through heat-treatment and cleaning process.

A BLC insulating layer 770 is deposited in all the structures of a substrate. The thickness is between 10-50 nm. And a thick interlayer insulating layer 785 is deposited on the BLC insulating layer 770. The source/drain contact plugs 375, 475, 575 in contact with the source/drain regions 340S/D, 440S/D, 540S/D are formed by patterning process, the metal wiring layers 390, 490, 590 are formed on the contact plugs 375, 475, 575. Afterwards, MLM (Multi-Layer Metal) interconnection structure with metal line is formed through various steps.

Figure 8:
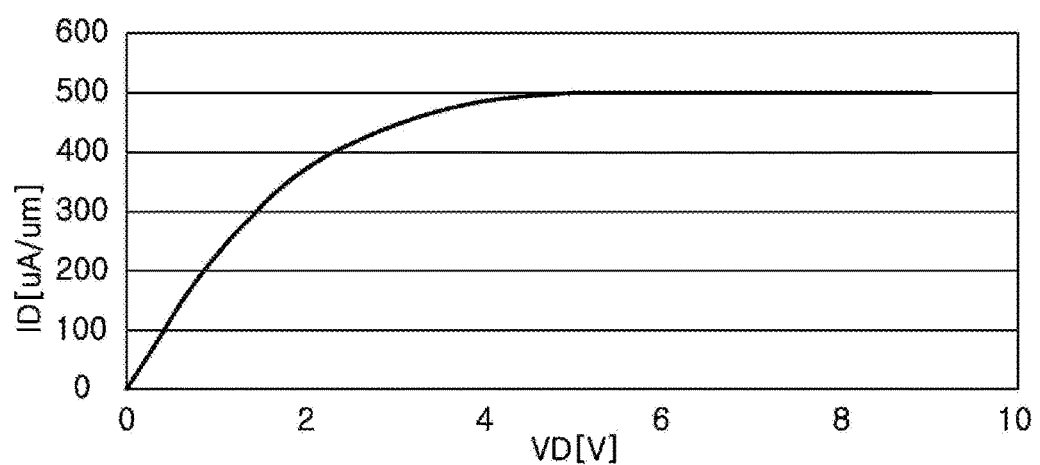
FIG. 8 is a graph illustrating an example of a current characteristic curve of a FV device of the present disclosure.

FIG. 8 is a graph illustrating a current characteristic of a FV device of the present disclosure.

As illustrated in FIG. 8, although a voltage corresponding to ½ of the voltage of the HV device 500 is applied to the gate and drain electrode of the FV device 400, a high drain current at the level of 500 uA is obtained.

By reducing the size of the AMP block more than 30%, the level of offset of the AMP is decreased by ½. A transistor leakage by gate oxide thinning on the top corner of a trench or degradation by hump effect is prevented by using a hybrid gate oxide manufactured by combining a CVD type oxide and a thermal oxide. Therefore, by decreasing the gate oxide thickness by about ½, the mismatching characteristic signifying the mismatch degree of a semiconductor device (transistor) is improved and further the offset characteristic of an amplifier is improved.

The semiconductor device structure for a display driver suggested by the present disclosure can also be used for an emissive device, LED display driver IC structure, or for a driver circuit IC for AM-OLED display as well as for a non-emissive device using light source. This is because the DC-DC converter used for OLED driving can be respectively manufactured for a source driver and for a gate driver.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a display driver semiconductor device, comprising:
    forming a plurality of trench isolating regions on a substrate defining a first region, a second region, and a third region;
    forming a high voltage well region on the substrate;
    forming a pair of low-concentration drift regions inside the high voltage well region on the second and third regions, respectively;
    forming a low voltage well region inside the high voltage well region on the first region;
    depositing a chemical vapor deposition (CVD) insulating layer through the first, second, and third regions of the substrate;
    patterning the CVD insulating layer to remove the CVD insulating layer on the first region and the second region;
    forming a first thermal oxide layer, a second thermal oxide layer, and a third thermal oxide layer on the first, second, and the third regions, respectively;
    removing the first thermal oxide layer by patterning and respectively forming a second gate insulating layer and a third gate insulating layer on the second and the third regions;
    forming a first gate insulating layer on the first region by forming the second thermal oxide layer on the first region; and
    forming a first gate electrode, a second gate electrode, and a third gate electrode on the first, second, and the third regions, respectively, by depositing and patterning a conductive material on the substrate.

2. The method for manufacturing the display driver semiconductor device of claim 1, further comprising:
    forming a Lightly Doped Drain (LDD) region on the first region after forming the first gate electrode, the second gate electrode, and the third gate electrode;
    forming a first spacer, a second spacer, and a third spacer on side walls of the first, second, and third gate electrodes, respectively;
    forming a first source and drain regions, a second source and drain regions, and a third source and drain regions on the first, second, and third regions, respectively;
    forming and patterning a silicide blocking insulating layer on the first region, the second region, and the third region;
    forming a silicide layer on the first source and drain regions, the second source and drain regions, the third source and drain regions, the first gate electrode, the second gate electrode, and third gate electrode;
    forming a Borderless contact (BLC) insulating layer on the substrate;
    forming an interlayer insulating layer on the BLC insulating layer;
    forming a first source and drain contact plugs, a second source and drain contact plugs, and a third source and drain contact plugs connected to the first source and drain regions, the second source and drain regions, and the third source and drain regions, respectively.

3. The method for manufacturing the display driver semiconductor device of claim 1, wherein the third gate insulating layer comprises a first insulating layer and a second insulating layer.

4. The method for manufacturing the display driver semiconductor device of claim 3, wherein the first insulating layer is a CVD insulating layer and the second insulating layer is a thermal oxide layer.

5. The method for manufacturing the display driver semiconductor device of claim 1, wherein the low voltage well region has a deeper depth than the low-concentration drift region.

6. The method for manufacturing the display driver semiconductor device of claim 2, wherein the source and drain regions of the third region is formed at a predetermined distance from the third spacer.

7. The method for manufacturing the display driver semiconductor device of claim 2, wherein the silicide blocking insulating layer is formed extended to the spacer and to the edge of the gate electrode.

8. The method for manufacturing the display driver semiconductor device of claim 1, wherein the first gate insulating layer has a thickness smaller than that of the second gate insulating layer.

9. The method for manufacturing the display driver semiconductor device of claim 1, wherein the first, the second, and the third gate electrodes are identical to each other in thickness, and lengths of the first and the second gate electrode are shorter than a length of the third gate electrode.

10. The method for manufacturing the display driver semiconductor device of claim 1, a dummy gate electrode is formed on the isolation region.

11. A display driver semiconductor device, comprising:
    a low voltage semiconductor device, comprising:
        a first gate insulating layer having a first thickness;
        a high-concentration first source region and a high-concentration first drain region;
        a pair of LDD regions having a shallower depth than depths of a first source doping region and a first drain doping region; and
        a first gate electrode;
    a half voltage semiconductor device formed adjacent to the low voltage semiconductor device, comprising:
        a second gate insulating layer having a second thickness;
        a high-concentration second source and a high-concentration second drain region;
        a pair of drift regions covering the high-concentration second source region and the high-concentration second drain region, respectively; and
        a second gate electrode; and
    a high voltage semiconductor device formed on a semiconductor substrate adjacent to the half voltage semiconductor device, the high voltage semiconductor device comprising:

a third gate insulating layer having a third thickness, the third gate insulating layer comprising a first insulating layer and a second insulating layer, the first insulating layer being a chemical vapor deposition (CVD) insulating layer and the second insulating layer being a thermal oxide layer;

a high-concentration third source region and a high-concentration third drain region;

a pair of drift regions covering the high-concentration third source region and the high-concentration third drain region, respectively; and a third gate electrode.

12. The display driver semiconductor device of claim 11, wherein a thickness of the second insulating layer is identical to the second thickness of the second gate insulating layer.

13. The display driver semiconductor device of claim 11, further comprising:

a first, second, and third spacers formed on the side walls of the first, second, third gate electrodes, respectively;

a first silicide layer formed on the third source region and the third drain region;

a second silicide layer formed on the third gate electrode;

a silicide blocking insulating layer formed between the first silicide layer and the second silicide layer;

a BLC insulating layer formed on the first silicide layer, the second silicide layer and the silicide blocking insulating layer;

an interlayer insulating layer formed on the BLC insulating layer; and a first, second, and third source and drain contact plugs connected with the first, second, and third source and drain regions, respectively.

14. The display driver semiconductor device of claim 13, wherein the silicide blocking insulating layer is formed extended to the third spacer and the edge of the third gate electrode.

15. The display driver semiconductor device of claim 11, wherein the first thickness of the first gate insulating layer is shallower than the second thickness of the second gate insulating layer.

16. The display driver semiconductor device of claim 11, wherein the first, the second and the third gate electrodes are identical to each other in thickness, and lengths of the first and the second gate electrodes are shorter than a length of the third gate electrode.

17. The display driver semiconductor device of claim 11, wherein the third source and drain region is formed at a predetermined distance from the third spacer.

18. A display driver semiconductor device, comprising:

a high voltage well region being formed on a substrate;

a first semiconductor device formed on the high voltage well region, the first semiconductor device comprising:

a first gate insulating layer having a first thickness;

a first source region and a first drain region disposed on opposite sides below the first gate insulating layer;

a pair of LDD regions, each LLD region being respectively partially disposed between the first source region and the first drain region; and a first gate electrode disposed above the first gate insulating layer;

a second semiconductor device formed adjacent to the first semiconductor device, the second semiconductor device comprising:

a second gate insulating layer having a second thickness;

a high-concentration second source and a high-concentration second drain region disposed on opposite sides below the second gate insulating layer;

a pair of drift regions disposed on opposite sides to cover the high-concentration second source region and the high-concentration second drain region, respectively; and a second gate electrode disposed above the second gate insulating layer; and a third semiconductor device formed adjacent to the second semiconductor device, the third semiconductor device comprising:

a third gate insulating layer having a third thickness;

a high-concentration third source region and a high-concentration third drain region disposed on opposite sides below the third gate insulating layer;

a pair of drift regions disposed on opposite sides to cover the high-concentration third source region and the high-concentration third drain region, respectively; and a third gate electrode disposed above the third gate insulating layer, wherein the third thickness has a size different than sizes of the first thickness and the second thickness.

19. The display driver semiconductor device of claim 18, wherein the third thickness has a size larger than sizes of the first thickness and the second thickness.

20. The display driver semiconductor device of claim 19, wherein the third gate insulating layer comprises a first insulating layer and a second insulating layer, and wherein the first insulating layer is formed using a chemical vapor deposition (CVD) process and the second insulating layer is formed using a thermal oxide process.

* * * * *